US012633886B2

(12) United States Patent

Hay

(10) Patent No.: US 12,633,886 B2

(45) Date of Patent: May 19, 2026

(54) ACTIVE BIASING AND TERMINATION APPROACH FOR DISTRIBUTED AMPLIFIER CIRCUIT

(71) Applicant: Analog Devices, Inc., Wilmington, MA (US)

(72) Inventor: Christopher Eugene Hay, Colorado Springs, CO (US)

(73) Assignee: Analog Devices, Inc., Wilmington, MA (US)

( * ) Notice: Subject to any disclaimer, the term of this patent is extended or adjusted under 35 U.S.C. 154(b) by 501 days.

(21) Appl. No.: 18/221,329

(22) Filed: Jul. 12, 2023

(65) Prior Publication Data

US 2025/0023527 A1      Jan. 16, 2025

(51) Int. Cl.
   *H03F 3/24*          (2006.01)
   *H03F 1/56*          (2006.01)

(52) U.S. Cl.
   CPC .............. *H03F 3/245* (2013.01); *H03F 1/56* (2013.01); *H03F 2200/18* (2013.01); *H03F 2200/451* (2013.01)

(58) Field of Classification Search
   CPC ..... H03F 3/245; H03F 2200/451; H01P 3/081
   USPC ......................................... 330/297
   See application file for complete search history.

(56) References Cited

U.S. PATENT DOCUMENTS

| | | | | |
|---|---|---|---|---|
| 4,595,881 A | * | 6/1986 | Kennan | H03F 3/607 |
| | | | | 330/277 |
| 5,021,743 A | * | 6/1991 | Chu | H03F 3/607 |
| | | | | 330/277 |
| 9,780,746 B1 | * | 10/2017 | Fujii | H03F 3/245 |
| 11,601,098 B2 | * | 3/2023 | Nobbe | H03F 3/45201 |
| 2002/0008583 A1 | * | 1/2002 | Shigematsu | H03F 3/607 |
| | | | | 330/286 |
| 2004/0124924 A1 | * | 7/2004 | Claveau | H03F 3/607 |
| | | | | 330/286 |
| 2005/0248407 A1 | * | 11/2005 | Friedrich | H03F 3/45183 |
| | | | | 330/286 |
| 2010/0019851 A1 | | 1/2010 | Benson | |
| 2017/0099038 A1 | | 4/2017 | Kobayashi | |
| 2018/0019712 A1 | * | 1/2018 | Kobayashi | H03F 3/195 |

(Continued)

OTHER PUBLICATIONS

Distributed Amplifiers, Oct. 21, 2019 by Christopher Gregoire et al. (Year: 2019).*

(Continued)

*Primary Examiner* — Hafizur Rahman

(74) *Attorney, Agent, or Firm* — Schwegman Lundberg & Woessner, P.A.

(57)                ABSTRACT

An integrated distributed amplifier circuit can include an input transmission line structure comprising first unit cells including a first reactive circuit element and a first active circuit element, an output transmission line structure comprising second unit cells including a second reactive circuit element and a second active circuit element, and a termination circuit coupled to an end of the input transmission line structure. The termination circuit can include a current mirror circuit to establish a specified bias current for biasing respective first active circuit elements of the input transmission line structure. Such an approach can provide one or more of a broadband termination impedance and stable biasing conditions across different frequencies and power output levels.

20 Claims, 10 Drawing Sheets

(56)　　　　References Cited

U.S. PATENT DOCUMENTS

2023/0112435 A1*　4/2023　Naseri Ali Abadi ... H03F 3/245
330/311

OTHER PUBLICATIONS

Analog Dialogue 51-09, 2017 (Year: 2017).*
Liu et al., Analysis of CMOS Amplifiers, IEEE Transactions on Microwave Theory and Techniques, vol. 63, No. 9, Sep. 2015 (Year: 2015).*
A State-of-the Art Review on Distributed Amplifiers, Shailesh, Garima Srivastava, Sachin Kumar, Accepted: Oct. 29, 2020 / Published online: Nov. 23, 2020, © Springer Science+Business Media, LLC, part of Springer Nature 2020 (Year: 2020).*
Triple-Stacked FET Distributed Power Amplifier Using 28 nm CMOS Process, Jihoon Kim and Youngje Sung, Electronics 2024, 13, 4433. https://doi.org/10.3390/electronics13224433 (Year: 2024).*
Ikalainen, Pertti K, et al., "Low-Noise Distributed Amplifier with Active Load", IEEE Microwave and Guided Wave Letters, 6(1), (Jan. 1996), 7-9.
Kimura, Shunji, et al., "0-40 GHz GaAs MESFET Distributed Baseband Amplifier IC's for High-S eed Optical Transmission", IEEE Transactions on Microwave Theory and Techniques, 44(11), (Nov. 1996), 2076-2082.
Kobayashi, Kevin W, et al., "A Novel 100 MHz—45 GHz Input-Termination-Less Distributed Amplifier Design With Low-Frequency Low-Noise and High Linearity Implemented With A 6

Inch 0.15 μm GaN-SiC Wafer Process Technology", IEEE Journal of Solid-State Circuits, 51(9), (Sep. 2016), 2017-2026.
"European Application Serial No. 24185034.6, Extended European Search Report mailed Nov. 15, 2024", 12 pgs.
"European Application Serial No. 24185034.6, Response filed Jul. 2, 2025 to Extended European Search Report mailed Nov. 15, 2024", w English Claims, 12 pgs.
Kevin, W Kobayashi, "A Monolithic DC Temperature Compensation Bias Scheme for Multistage HEMT Integrated Circuits", IEEE Transactions on Microwave Theory and Techniques, IEEE, USA, vol. 44, No. 2, (Feb. 11, 1996), 8 pgs.
Kobayashi, Kevin W, "Baseband to 140-GHz SiGe HBT and 100-GHz InP DHBT Broadband Triple-Stacked Distributed Amplifiers With Active Bias Terminations", IEEE Journal of Solid-State Circuits, vol. 55, No. 9, [Online]. Retrieved from the Internet: <URL:https://ieeexplore.ieee.org/stampPDF/getPDF.jsptp=&arnumber=9085413&ref=aHROcHM6Ly9pZWVleHBsb3JILmlIZWUub3JnL2RvY3VtZW50Lzkwwy0DUOMTM=>, (Sep. 11, 2020), 2336-2344.
Kobayashi, Kevin W, "A Novel 100 MHZ-45 GHz Input-TerminationLess Distributed Amplifier Design With Low-Frequency Low-Noise and High Linearity Implemented With A 6 Inch $0.15~\{ mu \} text\{m\}$ GaN-SiC Wafer Process Technology", IEEE Journal of Solid-State Circuits, IEEE, USA, vol. 51, No. 9, (Sep. 11, 2016), 2017-2026.
Sewiolo, B., "A 12-GHz High-Efficiency Tapered Traveling-Wave Power Amplifier With Novel Power Matched Cascode Gain Cells Using SiGe HBT Transistors", IEEE Transactions on Microwave Theory and Techniques, IEEE, USA, vol. 57, No. 10, (Oct. 11, 2009), 2329-2336.

* cited by examiner

Noise Factor, dB

Noise Factor, dB

Bias Circuit Termination Return Loss vs. C1

SF Bias = 4 mA
$R_{TERM}$ = 51 ohms
$C_{EXT}$ = 0  $C_{BYP}$ = 2pF

2pF

5pF

20pF m2
Freq=999.1kHz
dB(S(1,1))=-11.405 m7 m2
Freq=397.4MHz
dB(S(1,1))=-17.126

FREQ. (Hz)

Bias Circuit Termination Return Loss vs. $C_{EXT}$

SF Bias = 4 mA
$R_{TERM}$ = 51 ohms
C1 = 5pF  $C_{BYP}$ = 2pF

OF

10nF

1uF m2
Freq=1.995.1kHz
dB(S(1,1))=-10.740 m7 m2
Freq=397.4MHz
dB(S(1,1))=-17.400

FREQ. (Hz)

ACTIVE BIASING AND TERMINATION APPROACH FOR DISTRIBUTED AMPLIFIER CIRCUIT

FIELD OF THE DISCLOSURE

This document pertains generally, but not by way of limitation, to amplifier circuitry that can be implemented as an integrated circuit, and more particular, to biasing and transmission line termination circuitry for an integrated amplifier circuit that can have a distributed amplifier (DA) topology.

BACKGROUND

A variety of different amplifier circuit topologies can be implemented using integrated circuit technology. One class of amplifiers can include monolithically-integrated wideband amplifier circuits. As an illustration, such circuits can have an upper operating frequency specification in the range of tens of gigahertz (GHz), such as when implemented using high electron mobility transistor (HEMT) devices. Such circuits may have a minimum operating frequency specification that is orders of magnitude lower in frequency, depending on the application. For example, in some applications, such a minimum operating frequency specification may be in the megahertz (MHz) range or even lower (e.g., ones or tens of KHz). Applications for such wideband amplifiers may include communications, electronic warfare, radar, or metrology, such as supporting terrestrial cellular or microwave communications, electrical signal chain components in fiber optic communications systems, aviation or satellite-based communications systems, or remote sensing, as illustrative (but non-limiting) examples. Wideband amplifier circuits can also provide flexibility such as forming a portion of a signal chain in a software-defined radio architecture, particularly where such a radio architecture is frequency agile.

Different integrated amplifier circuit topologies can be used to achieve acceptable gain, linearity, and noise performance across a specified wideband operating frequency range. In one approach, a distributed amplifier (DA) topology can be used. Generally, a DA topology includes respective amplifier circuit sections (e.g., transconductor circuits) arranged in a cascaded manner to provide enhanced gain or bandwidth, or a combination of both (e.g., gain-bandwidth product), as compared to a single amplifier circuit section.

SUMMARY OF THE DISCLOSURE

Distributed Amplifier (DA) circuit topologies generally include amplifier circuit sections coupled to each other in a cascaded manner, as mentioned above. As an illustration, a DA circuit can include amplifier circuit sections comprising a cascode circuit topology, with respective sections coupled to each other using reactive circuit elements. In this manner, respective transistor and reactive circuit elements can form cells of artificial transmission line structures, where the transistor provides a shunt capacitance, and the reactive circuit element provides a series inductance. As an illustration, a DA circuit can be implemented monolithically using field effect transistors (FETs), forming amplifier circuit sections coupled to each other using monolithically co-integrated transmission line segments or monolithically co-integrated inductors to provide series inductance between the respective amplifier circuit sections, with a gate-tosource capacitance of respective FETs providing a shunt capacitance for respective cells.

A signal input port to the DA circuit can include a node coupled to gate structures of respective FETs defining an artificial input transmission line structure. In order to provide impedance matching across a specified range of operating frequencies, an input port and an output port of a transmission line structure are generally coupled to matched impedances corresponding to a characteristic impedance of the transmission line (nominally a real-valued impedance of about 50 ohms). Such a matched impedance can include use of a discrete termination circuit at the end of the transmission line. In one approach, the termination circuit can include passive circuitry, such as a resistor, along with one or more other components such as one or more alternating current (AC) coupling capacitors in series with a termination resistor. The termination resistor can be implemented on-chip, monolithically integrated with other components. AC coupling capacitors can also be located on-chip, or a combination of on-chip and off-chip components can be used.

The present inventor has recognized that use of off-chip passive components can present various challenges. Such challenges can include unwanted resonances formed by a combination of lead or bond-wire loop inductance or other package parasitic effects, such as in combination with an AC coupling capacitor. Such resonances can cause non-uniformity in gain and return loss performance across frequencies, for example. Such an arrangement can also be inefficient in terms of circuit area. The present inventor has recognized that use of an on-chip termination circuit can help address such challenges, and such a termination circuit can use either passive circuitry, or an active termination circuit (e.g., a transistor-based circuit where the transistor itself serves as a termination load device), or combinations thereof.

The present inventor has also recognized that, for an input transmission line structure of the DA circuit, use of an active termination circuit can also provide direct current (DC) gate biasing for input devices in respective amplifier circuit sections. For example, a diode-connected transistor topology (e.g., a FET circuit with the drain and source connected to each other) can provide a current mirror circuit, such as to establish a desired bias current through the input devices in respective amplifier circuit sections, while contemporaneously providing a termination impedance for the input transmission line. In this manner, the diode-connected transistor topology can provide a current reference.

As an illustration, and as shown by simulation results, use of termination and biasing approaches described herein can provide enhanced performance in DA circuits, such as those implemented using gallium arsenide (GaAs) enhancement-mode pseudomorphic high-electron-mobility transistor devices (e-mode pHEMTs), allowing a DA circuit to function down to lower operating frequencies (e.g., a lower operating frequency limit of 1 MHz to 10 MHz or less) as compared to approaches using passive off-chip termination circuits, while still preserving high frequency performance. Such approaches are also applicable to other transistor types and semiconductor materials.

In an example, a distributed amplifier circuit comprises an input transmission line structure comprising first unit cells, a respective one of the first unit cells comprising a first reactive circuit element and a first active circuit element, the first reactive circuit element coupled to an input node of the first active circuit element, an input port of the input transmission line structure defining a signal input port of the distributed amplifier circuit, an output transmission line structure comprising second unit cells, a respective one of the second unit cells comprising a second reactive circuit element and a second active circuit element, the second reactive circuit element coupled to an output node of the second active circuit element, an output port of the output transmission line structure defining an amplified signal output port of the distributed amplifier circuit, and a termination circuit coupled to an end of the input transmission line structure, the termination circuit configured to establish a specified termination impedance, the termination circuit comprising a current mirror circuit to establish a specified bias current for biasing respective first active circuit elements of the input transmission line structure. The respective first active circuit elements can be coupled with respective second active circuit elements to form respective amplifier circuits, the respective amplifier circuits coupled with each other in a cascaded manner using respective first reactive circuit elements and respective second reactive circuit elements.

In an example, the current mirror circuit is configured to establish the specified bias current and to act as a dissipative element terminating the input transmission line structure. For example, the current mirror circuit can include a diode-connected transistor monolithically co-integrated with the respective first active circuit elements and the respective second active circuit elements. In another example, the termination circuit comprises a passive termination coupled with the current mirror circuit.

In an example, the termination circuit comprises a driver circuit, the driver circuit controlled by the current mirror circuit and configured to maintain the specified bias current for biasing respective first active circuit elements. A resistor located within a feedback loop defined by the driver circuit and the current mirror circuit can provide termination, at least in part.

In an example, a distributed amplifier circuit comprises an input transmission line structure, an output transmission line structure, a termination circuit coupled to an end of the input transmission line structure, the termination circuit configured to establish a specified termination impedance, the termination circuit comprising a current mirror circuit to establish a specified bias current for biasing respective first active circuit elements of the input transmission line structure, and a feedback resistor coupled between a node corresponding to the end of the input transmission line structure and a node of an output port of the output transmission line structure, a value of the feedback resistor establishing the specified bias current at least in part. The current mirror circuit can be monolithically co-integrated with the respective first active circuit elements, and the distributed amplifier circuit can include a bias control node coupled to the current mirror circuit, the bias control node coupleable to a bias control component that is not monolithically co-integrated with the current mirror circuit.

In an example, a monolithically-integrated distributed amplifier circuit comprises an input transmission line structure comprising respective first active circuit elements, an output transmission line structure comprising respective second active circuit elements, and a termination circuit coupled to an end of the input transmission line structure, the termination circuit configured to establish a specified termination impedance, the termination circuit comprising a current mirror circuit to establish a specified bias current for biasing the respective first active circuit elements of the input transmission line structure. The respective first active circuit elements and the respective second active circuit elements can include compound-semiconductor high-electron-mobility transistors (HEMTs), and the current mirror circuit comprises a diode-connected field effect transistor (FET).

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Distributed amplifier (DA) circuits generally include a termination circuit at the end of an input transmission line structure that is matched to a characteristic impedance of the transmission line structure (e.g., providing a similar real-valued impedance or a conjugate complex-valued imped-ance). For example, when the DA circuit is implemented using Field Effect Transistors (FETs), the input transmission line can be referred to a "gate transmission line." The termination circuit is generally configured to achieve high return loss (e.g., corresponding to matching performance) and flat gain over the specified operating bandwidth of the DA circuit. As mentioned elsewhere herein, in one approach such termination can be established using a resistor (e.g., passive termination).

Because the amplifying transistors in the DA circuit are DC-biased, a passive gate termination resistor may be connected to a reference node through an AC coupling capacitor, or DC blocking capacitors are placed in the circuit to isolate the transistor DC bias from being upset by the gate termination resistor. Use of AC coupling capacitors or DC blocking capacitors (or both) can impact a minimum operating frequency limit of the DA circuit. Larger values of the AC coupling or DC blocking capacitors can be used to enhance minimum operating frequency performance (e.g., pushing the minimum operating frequency limit to a lower frequency). However, such capacitors are generally located "off-chip" due to their relatively large capacitance values and as a result form resonances due to interaction with parasitic inductances such as integrated circuit package wire bond or other interconnect structures such as circuit board traces, and such resonances can result in undesirable ripple in the gain and input return loss responses of the DA circuit.

The examples herein can address one or more challenges such as those mentioned above. For example, the examples described below in relation to FIG. 1 and FIG. 6 can contemporaneously provide DC biasing and a broadband termination impedance for meeting a specified input return loss and flat gain without requiring multiple large-valued off chip AC coupling capacitors. As an illustration, using gen-erally-realizable on-chip capacitor values and topologies as shown herein, a minimum operating frequency limit of around 1 MHz (or lower) can be achieved. If an off-chip capacitor is added, optionally, such a capacitor can be isolated from the broadband amplification portion of the DA circuit to avoid perturbing return loss or impacting gain flatness, and a minimum operating frequency limit in the range of kHz or less can be achieved.

Figure 1:
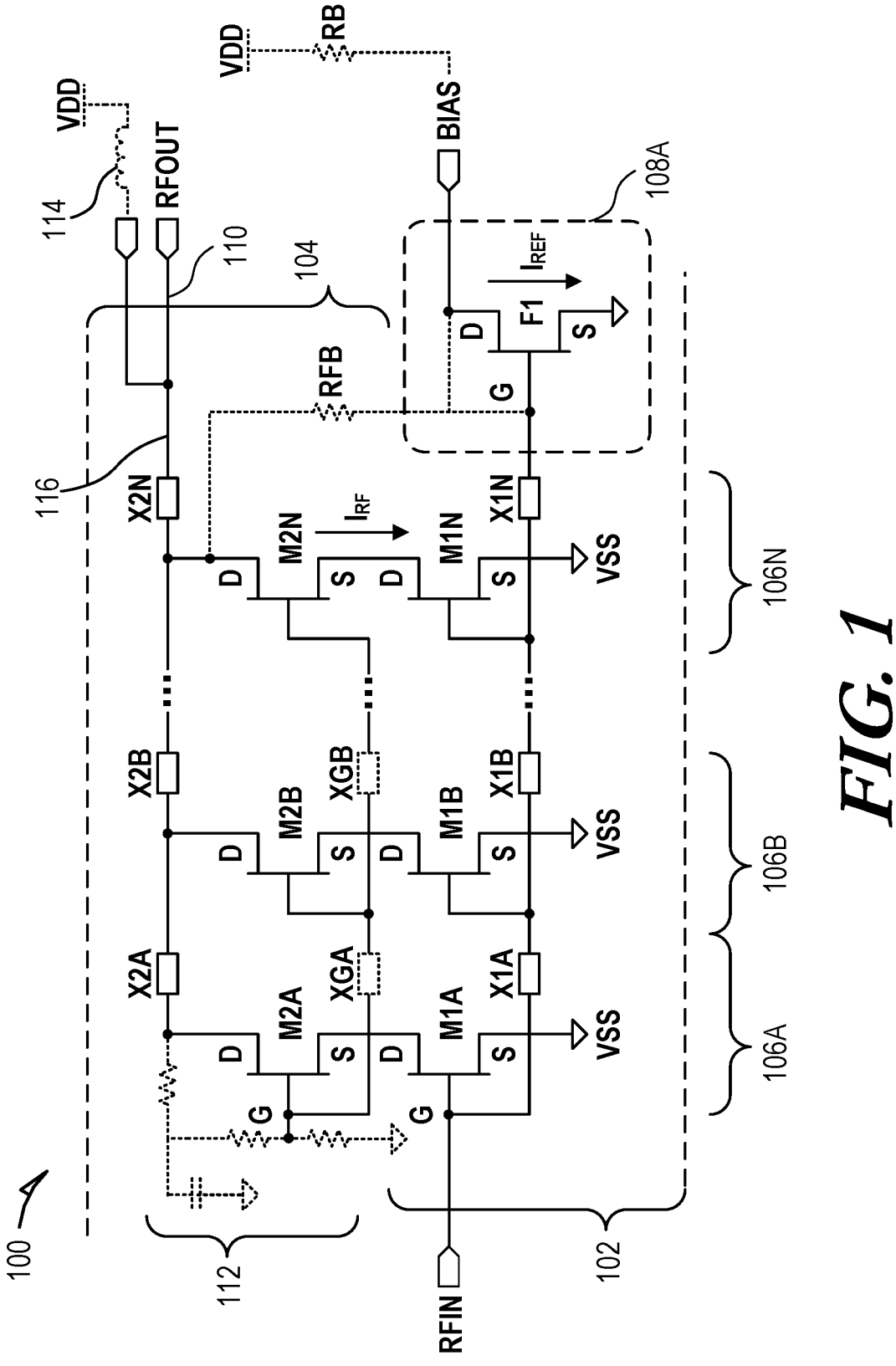
FIG. 1 illustrates an example representing a distributed amplifier (DA) circuit topology comprising an active termination circuit that can also provide gate biasing.

FIG. 1 illustrates an example representing a distributed amplifier (DA) circuit 100 topology comprising an active termination circuit 108A that can also provide gate biasing. The DA circuit 100 of FIG. 1 can include multiple amplifier circuit sections, such as a first amplifier circuit section 106A comprising monolithically-integrated enhancement mode FET devices M1A and M2A, arranged in a cascaded manner with a second amplifier circuit section 106B comprising FET devices M1B and M2B, and so on, with a last amplifier circuit section 106N comprising FET devices M1N and M2N. Respective transmission line structures couple the respective amplifier circuit sections to each other, such that each amplifier circuit section 106A, 106B, . . . 106N makes a gain contribution. In this manner, a gain-bandwidth prod-uct for the DA circuit 100 is enhanced overall versus using a single amplifier circuit section. For various applications, a count of amplifier circuit sections 106A, 106B, . . . 106N can range from three to ten sections, or more.

As mentioned above, a DA circuit can establish respective transmission line structures. For example, as shown in FIG. 1, the DA circuit 100 can include an input transmission line structure 102, such as establishing an "artificial" transmis-sion line formed by respective unit cells, corresponding to discrete elements but not requiring discrete passive lumped elements. The input transmission line structure 102 can include first unit cells comprising a FET device (e.g., M1A) and a first reactive circuit element X1A (e.g., an integrated circuit transmission line segment or an integrated inductor) connected to a gate of the FET device M1A. In this manner, the FET device M1A gate-to-source junction contributes a shunt capacitance to the artificial transmission line unit cell, along with a series inductance provided by the first reactive circuit element X1A. Each respective amplifier circuit sec-tion 106A, 106B, . . . 106N can establish a respective unit cell along the input transmission line structure 102.

A DA circuit can also include an output transmission line structure, establishing another artificial transmission line, the output transmission line structure 104. For example, as shown in FIG. 1, an output transmission line structure 104 can include second unit cells comprising a FET device (e.g., M2A) and a first reactive circuit element X2A (e.g., an integrated circuit transmission line segment or integrated inductor) connected to a drain of the FET device M2A. An output end of the output transmission line structure 104 can include a node RFOUT, such as providing a portion of a signal output port of the DA circuit (e.g., a single-ended output port defined as the node RFOUT and a reference node such as VSS). Generally, the output transmission line structure 104 can also be used to provide power to the FET devices M2A, M2B, . . . . M2N, such as including a node 116 at an output end of the output transmission line structure 104 fed by a positive supply, VDD, such as through a biasing network (e.g., comprising a series inductor 114, located off-chip from a remainder of the DA circuit 100). An opposite end of the output transmission line structure 104 can include passive circuitry 112 for termination and gate biasing of the FET devices M2A, M2B, . . . . M2N. Gate biasing circuitry for M2A, M2B, . . . . M2N can include series circuit elements XGA, XGB, such as shown illustratively in FIG. 1.

An input end of the input (e.g., gate coupled) transmission line structure 102 can include a node RFIN, such as providing a portion of a signal input port to the DA circuit 100 (e.g., a single-ended input port defined as the node RFIN and a reference node such as VSS). An end of the input transmission line structure 102 can be terminated using an active termination circuit 108A. The present inventor has recognized, among other things, that the active termination circuit 108A can also provide gate biasing for the respective FET devices M1A, M1B, . . . . M1N contemporaneously with providing a specified termination impedance. As shown illustratively in FIG. 1, the termination circuit can include a FET device F1 arranged in a diode-connected configuration where a gate input and drain node are connected together. A feedback resistor RFB or external bias resistor RB (or both) can be used to establish a DC biasing reference current, $I_{REF}$, through the FET device F1, providing a current mirror circuit topology to induce a corresponding (e.g., proportional to a first order approximation) bias current, $I_{RF}$, through the respective amplifier circuit sections 106A, 106B, . . . 106N. Generally, the FET device F1 is similar to corresponding FETs M1A, M1B, . . . . M1N, such as having a proportionately smaller periphery, different gate width, or count of gate fingers, as illustrative examples, such that $I_{RF}$ is a specified multiple of $I_{REF}$ under quiescent conditions. Physical characteristics of F1 such as geometry and location can be established to reduce or suppress variation of $I_{REF}$ over temperature and process variation, in addition to meeting a specified termination impedance value.

The configuration of the active termination circuit 108A of FIG. 1 differs from an active biasing approach where the FET device F1 is not serving as a dissipative termination circuit element. In such a non-terminating approach, an inductor or large-valued resistor (e.g., in kiloohm (kΩ) range) would generally be used to couple a current mirror biasing circuit to the amplifier circuit section 106N. In the approach shown in FIG. 1, such an inductor or large-valued resistor is not required, and the active termination circuit 108A can be connected directly to the amplifier circuit section 106N to provide a specified termination impedance (e.g., a real-valued impedance of around 50 ohms or an appropriate real and reactive impedance to provide a conjugate match to the input transmission line structure 102).

Optionally, as shown in FIG. 1, a monolithically-integrated feedback resistor RFB can be included as a portion of the DA circuit 100. In the approach shown in FIG. 1, a DC blocking capacitor is not required in series with the RFM, and accordingly, a value of RFB can help to set the reference current $I_{REF}$, at least in part. Because RFB generally has a value that is established for achieving DA circuit 100 amplification performance (e.g., gain flatness or linearity), RFB may not have a value low enough to achieve a desired reference current $I_{REF}$. Optionally, another resistor, RB, can be used (either on or off-chip) to establish a desired reference current $I_{REF}$ for gate biasing, without perturbing feedback behavior provided by RFB. For example, a bias control node (BIAS), such as an integrated circuit pad or integrated package "pin" can expose BIAS, which is coupleable to an off-chip resistor RB or other bias control component.

If RB is used, a DC blocking capacitor can be included in series with RFB, and accordingly, RB would be used to set $I_{REF}$, or RFB can be omitted entirely. Such approaches can provide more flexibility selecting characteristics for F1 to provide the specified (e.g., 50-ohm) termination impedance. Including a DC blocking capacitor in series with RFB may result in a higher minimum operating frequency for the DA circuit 100 (e.g., the minimum operating frequency would generally be increased).

Figure 2:
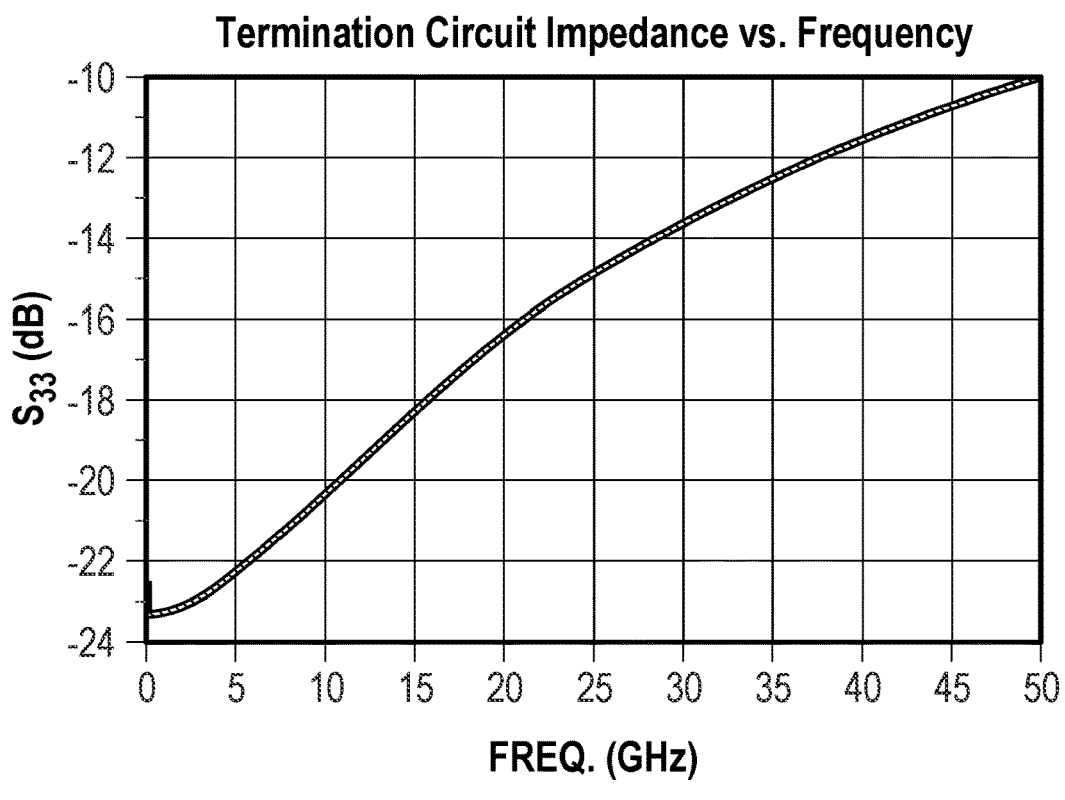
FIG. 2 shows an illustrative example of a simulated return loss (corresponding to the active termination circuit impedance) versus frequency, showing matching performance into the tens of GHz.

FIG. 2 shows an illustrative example of a simulated return loss (corresponding to the active termination circuit 108A impedance) versus frequency, showing matching performance into the tens of GHz. For example, as shown in FIG. 2, an $S_{11}$ value of less than −10 dB corresponds to a return loss 10 dB or higher (e.g., better), or a voltage standing wave ratio (VSWR) of about 2:1 or better.

Figure 3:
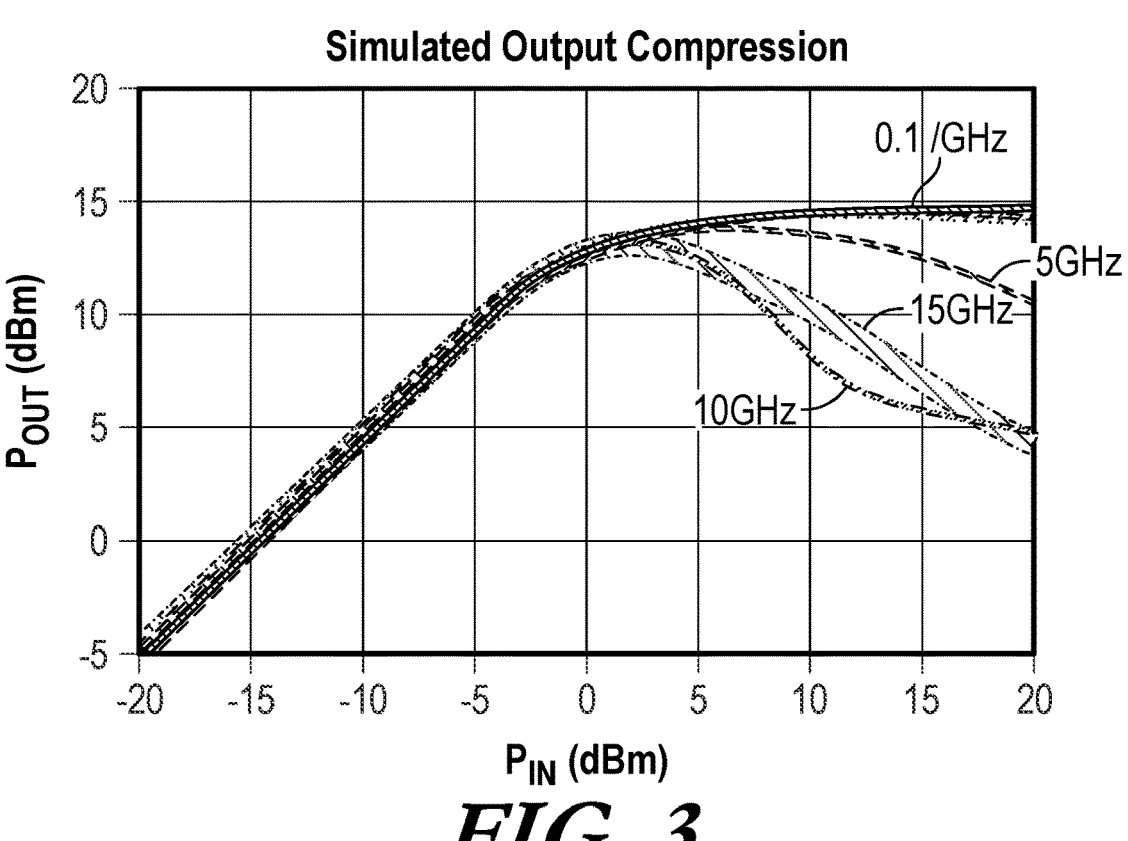
FIG. 3 shows an illustrative example of a simulated output power versus input power for various frequencies, illustrating gain compression behavior due at least in part to the use of the active termination circuit.

FIG. 3 shows an illustrative example of a simulated output power versus input power for various frequencies, illustrating gain compression behavior due at least in part to the use of the active termination circuit 108A. Use of a diode-connected FET structure, without more, may result in variation in gain compression behavior versus frequency, such as showing an increasingly non-monotonic compression curve as frequency increases. Such an effect can be due to the FET device F1 providing rectification of the AC signal (e.g., an RF signal) being amplified by the DA circuit 100. The rectification can upset the bias of FET devices M1A, M1B, . . . . M1N by decreasing the gate-to-source voltage, down-biasing such FET devices, and reducing a corresponding drain current, as the input signal power to the DA circuit 100 increases. The approach of FIG. 6 can help to reduce or suppress such gain "turn-over" in the DA circuit 100 (where output power turns from a positive slope to a negative slope in response to increasing input power), such as using a combination of a termination resistor and a source-follower as a driver circuit. In particular, the source-follower can reduce or suppress the down-biasing behavior mentioned above.

Figures 4A, 4B, 4C:
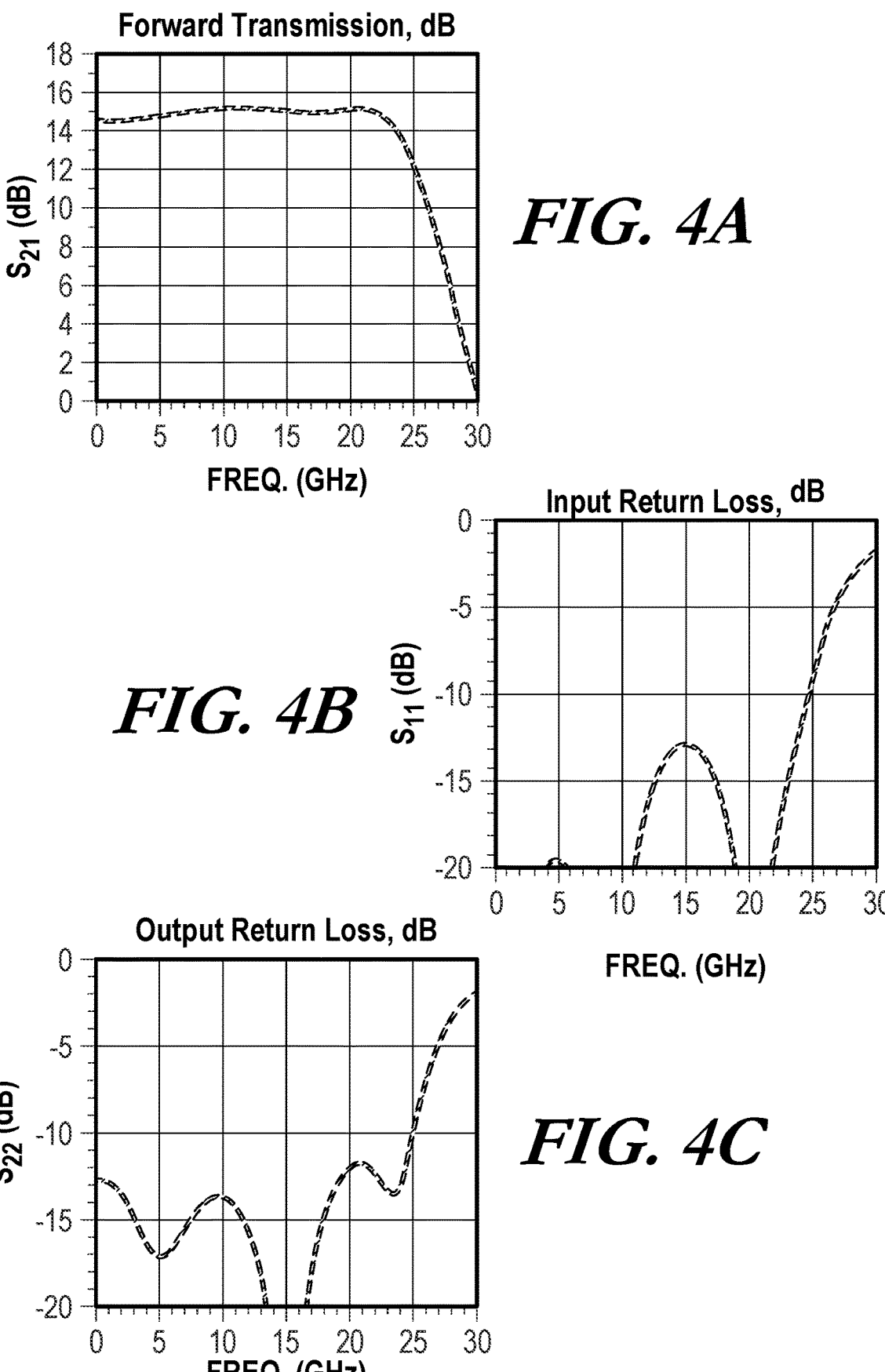
FIG. 4A shows an illustrative example of a simulated forward transmission gain (e.g., $S_{21}$ parameter) through the DA circuit of FIG. 1.
FIG. 4B shows an illustrative example of a simulated input return loss (e.g., $S_{11}$ parameter) through the DA circuit of FIG. 1.
FIG. 4C shows an illustrative example of a simulated output return loss (e.g., $S_{22}$ parameter) through the DA circuit of FIG. 1.

FIG. 4A shows an illustrative example of a simulated forward transmission gain (e.g., $S_{21}$ parameter) through the DA circuit 100 of FIG. 1. Gain performance shows relatively flat gain through just under 25 GHz (−3 dB). FIG. 4B shows an illustrative example of a simulated input return loss (e.g., $S_{11}$ parameter) through the DA circuit 100 circuit of FIG. 1, showing RF input matching having a return loss of better than 10 dB (corresponding to an S11 parameter of −10 dB or lower) through just under 25 GHz. FIG. 4C shows an illustrative example of a simulated output return loss (e.g., $S_{22}$ parameter) through the DA circuit 100 circuit of FIG. 1, also showing output matching having a return loss of better than 10 dB through about 25 GHz. FIG. 4A, FIG. 4B, and FIG. 4C also illustrate the low frequency performance of the DA circuit 100 extends down to at least 1 KHz or lower, with the simulations of FIG. 4A, FIG. 4B, and FIG. 4C spanning a frequency range of 1 KHz to 30 GHz.

Figure 5A:
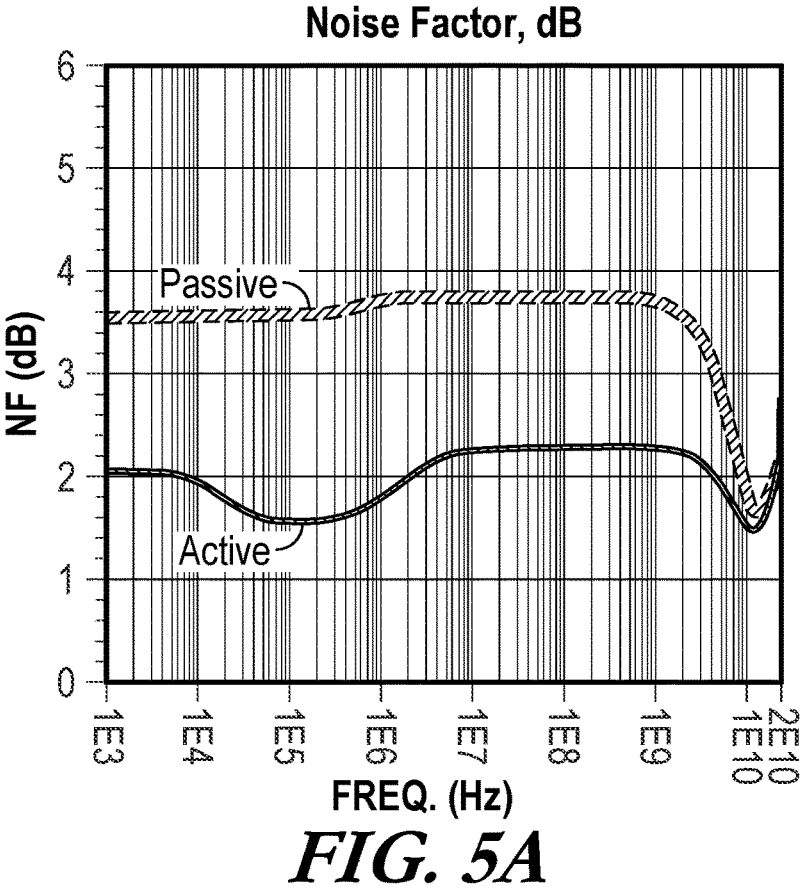
FIG. 5A shows an illustrative example of a simulated noise factor (in dB, corresponding to noise figure, plotted with respect to frequency using logarithmic scaling of the frequency axis), comparing a DA circuit similar to FIG. 1 but using passive termination, versus the DA circuit of FIG. 1 including active termination.
Figure 5B:
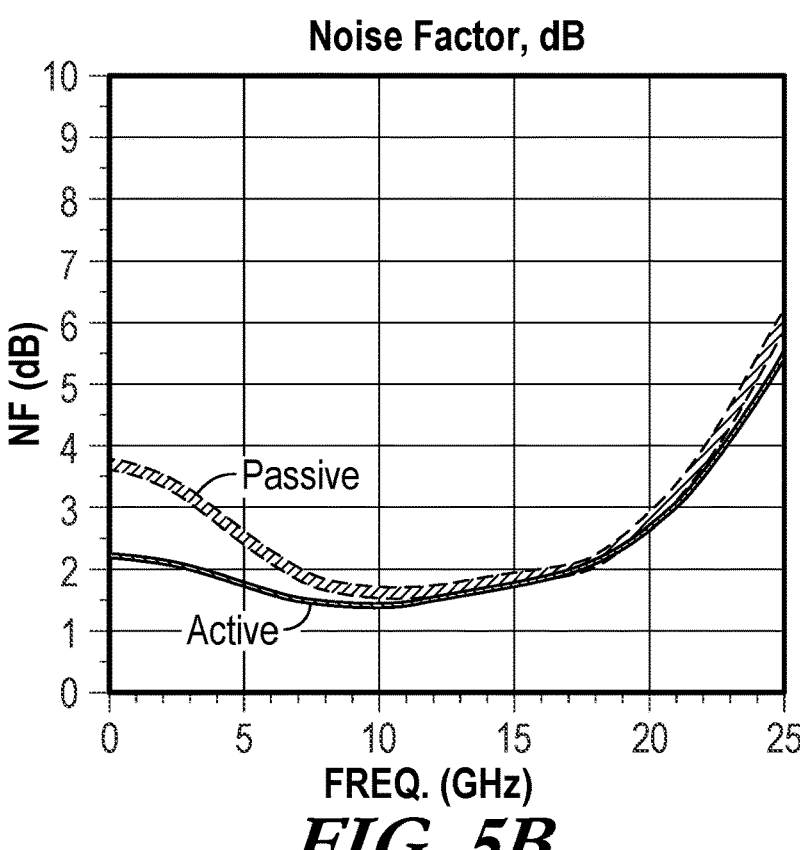
FIG. 5B shows an illustrative example of a simulated noise factor (in dB, corresponding to noise figure, plotted with respect to frequency using linear scaling of the frequency axis), comparing a DA circuit similar to FIG. 1 but using passive termination, versus the DA circuit of FIG. 1 including active termination.

For purposes of comparison FIG. 5A shows an illustrative example of a simulated noise factor (in dB, corresponding to noise figure, plotted with respect to frequency using logarithmic scaling of the frequency axis), comparing a DA circuit similar to FIG. 1 but using passive termination, versus the DA circuit of FIG. 1 including active termination, and FIG. 5B shows an illustrative example of a simulated noise factor (in dB, corresponding to noise figure, plotted with respect to frequency using linear scaling of the frequency axis). Use of the active termination circuit 108A approach of FIG. 1 versus a passive resistive termination can provide noise factor (corresponding to noise figure) that is around 1.5 dB lower (better) than the passive resistive termination approach at low frequencies (e.g., to 1 kHz or lower).

Figure 6:
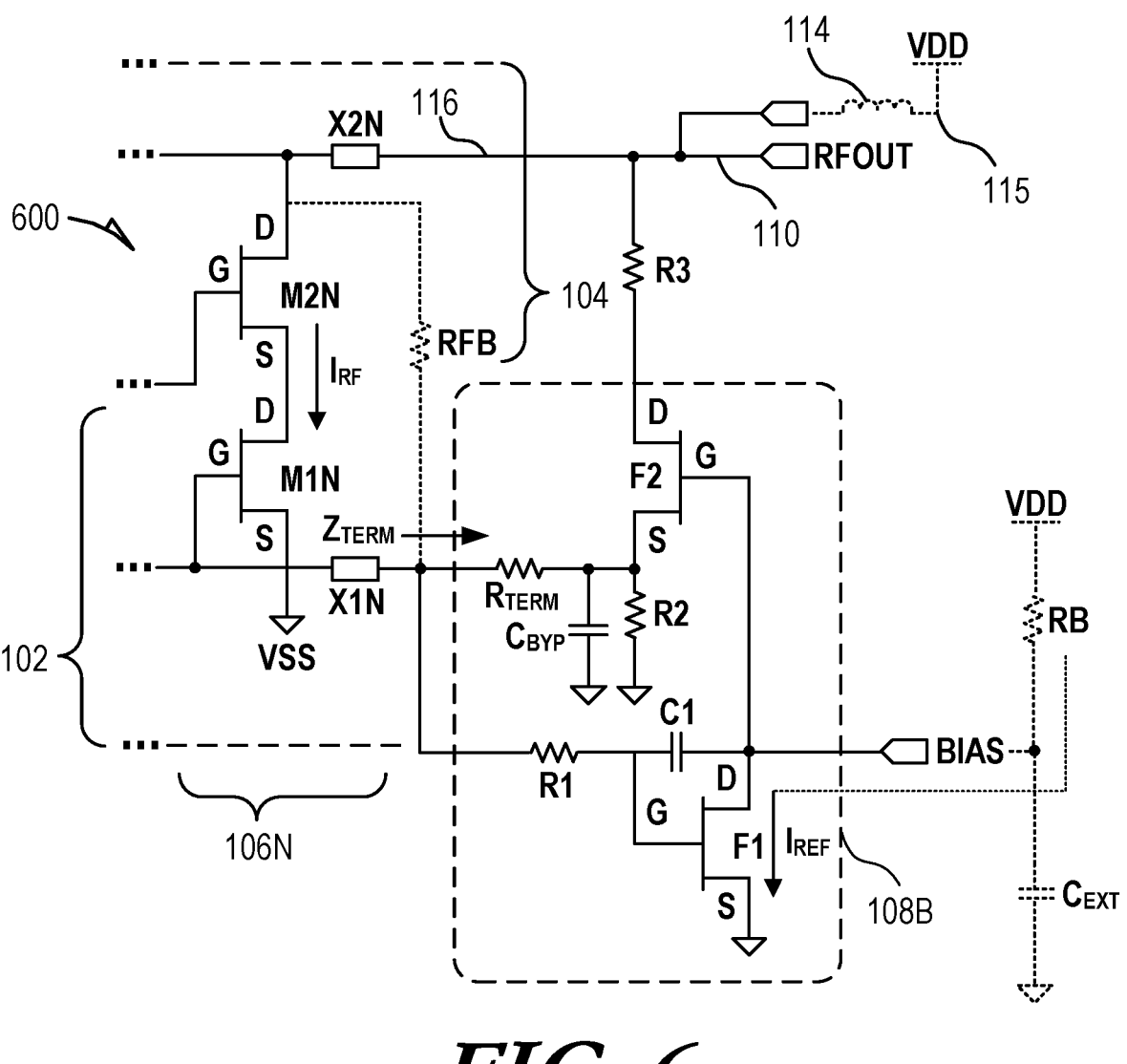
FIG. 6 illustrates an example representing a distributed amplifier (DA) circuit topology comprising an active termination circuit that can also provide gate biasing, where the active termination circuit includes a driver circuit (e.g., a source-follower circuit) and corresponding feedback loop.

FIG. 6 illustrates an example representing a distributed amplifier (DA) circuit 600 topology comprising a termination circuit 108B that can also provide gate biasing, where the termination circuit 108B includes a driver circuit (e.g., a "helper") comprising a FET device F2 (e.g., arranged as a source-follower circuit) and corresponding feedback loop, where the loop is formed by a current mirror circuit reference FET device F1, series resistor R1, termination resistor $R_{TERM}$, and FET device F2. The DA circuit 600 can be otherwise similar to the DA circuit 100 of FIG. 1, with an architecture comprising cascaded amplifier circuit sections, such as the last amplifier circuit section 106N comprising FET devices M1N and M2N, an input transmission line structure 102 (with a last cell comprising M1N and reactive circuit element X1N), an output transmission line structure 104 (with the last cell comprising M2N and reactive circuit element X2N), with an internal supply node 116 fed by a supply VDD, such as through an inductor 114, and including an output port defined by a node RFOUT 110. The FET device F2 drain terminal can be coupled to the internally supply node 116, such as through a resistor R3, such as to isolate the FET device F2 from the RF output signal provided at RFOUT. As another example, the drain terminal of the FET device F2 can be exposed via a pad or package pin, such as can be coupled off-chip to the supply VDD, such as at a node 115 where the inductor 114 isolates node 115 from the RF output signal at RFOUT.

In a manner similar to FIG. 1, the current mirror reference FET device F1 can have a bias current set by a resistor RB (such as an off-chip resistor separate from other monolithically-integrated circuitry shown in FIG. 6), or set using a current source. In another example, such as where a complementary transistor fabrication process is used, an on-chip current source can be used to set the reference current $I_{REF}$. By contrast with FIG. 1, the termination circuit 108B of FIG. 6 includes a passive termination resistor $R_{TERM}$, in series between the input transmission line structure 102 and a source node of the driver circuit FET device F2. In this manner, the termination resistor $R_{TERM}$ is within the feedback loop of a current mirror reference circuit, and loop gain behavior presents a low impedance looking into the termination circuit 108B within the loop bandwidth, allowing the DC gate bias voltage and corresponding drain current of devices M1A, M1B, . . . . M1N to be maintained. As an illustration, the loop bandwidth can be set using monolithically co-integrated capacitors, without requiring external off-chip capacitors. As an illustration, a loop bandwidth can be set to around 1 MHz (e.g., where loop gain drops to about 0 dB), such as dominated by a pole established using the combination of R1 and C1 values in the termination circuit 108B. A lower-frequency pole can be created such as using a combination of RB and $C_{EXT}$, where $C_{EXT}$ is effectively decoupled from the amplifier sections such as 106N by the feedback network. In this manner, $C_{EXT}$ does not otherwise impact the high frequency performance of the DA circuit 600 with unwanted resonances. Use of a combination of RB and $C_{EXT}$ can extend loop bandwidth down to KHz range (see simulation results below such as at FIG. 7B and FIG. 8B). As an illustrative example, where no off-chip $C_{EXT}$ capacitor is present, where C1 is set to 5 pF, and where $C_{BYP}$ is set to 2 pF, simulation results indicate a phase margin of greater than 90 degrees (where loop gain falls to unity, at about 2 MHz) and a gain margin of over 40 dB for the termination circuit 108B feedback loop, assuming a source-follower bias current of 4 mA. Where $C_{EXT}$ is set to 10 nF, the 0 dB bandwidth is just over 1 KHz, with greater than 90 degrees of phase margin, and a corresponding gain margin of tens of dB.

In the example of FIG. 6, a capacitor, $C_{BYP}$, is shown on the source node of the source-follower FET device F2. $C_{BYP}$ can assist in maintaining a specified termination impedance across the operating bandwidth of the DA circuit 600. Resistor R2 can provide DC biasing of the source-follower FET device F2. Other techniques can be used, such as a current source, though use of an active current source versus a passive resistor may negatively impact noise factor linearity, for example. The termination circuit 108B of FIG. 6 is capable of sinking a DC current in addition to sourcing DC current. Accordingly, if a feedback resistor RFB is included, a DC blocking capacitor is not required in series with RFB. As mentioned above, use of a series DC blocking capacitor can hinder low frequency performance of the DA circuit 600 (e.g., resulting in a higher minimum operating frequency as compared to a topology without a series DC blocking capacitor).

As in the example of FIG. 1, the quiescent bias current $I_{RF}$ is generally a scaled representation of $I_{REF}$, to a first order, scaled by a periphery ratio of F1 versus M1N, for example. $I_{REF}$ corresponds approximately to a value (VDD−2*VGS)/ RB where no feedback resistor RFB is included, or where there is a DC blocking cap in series with RFB (e.g., where there is no DC current through $R_{TERM}$). RB can be a discrete-valued resistor located off-chip where, for example, 1% tolerance is acceptable. Alternatively, in addition, or instead, one or more resistors can be monolithically co-integrated with other portions of the DA circuit 600 connected in a manner similar to RB.

The present inventor has recognized, among other things, that locating $R_{TERM}$ within the termination circuit 108B feedback loop allows $I_{RF}$-to-$I_{REF}$ current scaling to be maintained while also providing a specified termination impedance. As mentioned above, a loop bandwidth of the feedback looped formed by the termination circuit 108B can be established at least in part by a resistor-capacitor (RC) loop filter formed by the values of R1 and C1. Where the loop gain of the termination circuit 108B feedback loop drops below unity, the termination impedance $Z_{TERM}$ can be represented as $Z_{TERM}=R_{TERM}+(R2\|Z_{SF})$, where $Z_{SF}$ represents an impedance looking into the source of FET device F2. $R_{TERM}$, F2, and R2 can be specified to establish a desired DA circuit 600 amplifier input return loss and noise figure. F2 is also sized and biased to maintain a bias current $I_{RF}$ sufficient to preserve specified linearity and distortion performance of the DA circuit 600 (e.g., as indicated by third-order intercept or gain compression behavior). Because an effective impedance associated with resistor R2 in parallel with $Z_{SF}$ will be relatively low in magnitude in comparison to $R_{TERM}$, a value of $R_{TERM}$ can be around 50 ohms, as an illustrative example. According to simulation, the DC bias current $I_{RF}$ stays relatively constant over temperature and variation of process parameters, as shown below in TABLE 1 and TABLE 2, and as indicated by $I_{RF}$ and overall $I_{DD}$ quiescent DC current values.

TABLE 1

$I_{RF}$ and $I_{DD}$ quiescent current values simulated with varying fabrication process parameters, and a constant temperature of 25 C.

|  | $I_{RF}$ (mA, per section) | $I_{DD}$ (mA, total) |
|---|---|---|
| Nominal | 23.1 | 82.2 |
| Max | 24.8 | 86.2 |
| Min | 21.8 | 79.4 |
| % Variation | +/−7% | +/−5% |

TABLE 2

$I_{RF}$ and $I_{DD}$ quiescent current values simulated with varying temperature and assuming nominal process parameters.

|  | $I_{RF}$ (mA, per stage) | $I_{DD}$ (mA, total) |
|---|---|---|
| −55 C. | 23.2 | 82.6 |
| 25 C. | 23.1 | 82.2 |
| 85 C. | 23.3 | 82.8 |
| 125 C. | 24 | 85 |

For the simulation results shown above in TABLE 1 and TABLE 2, corner analysis was performed. For example, such corners included FET parameters that impact DC performance such as threshold voltage variation (e.g., Ids VS. $V_{gs}$), and transconductance ($G_m$) variation vs. $V_{gs}$. FET parameters that impact RF performance were also included, along with resistor (film/mesa) and metal-insulator-metal (MIM) capacitor variation. The corner cases covered 3-sigma variation for each of the parameters.

Figure 7A:
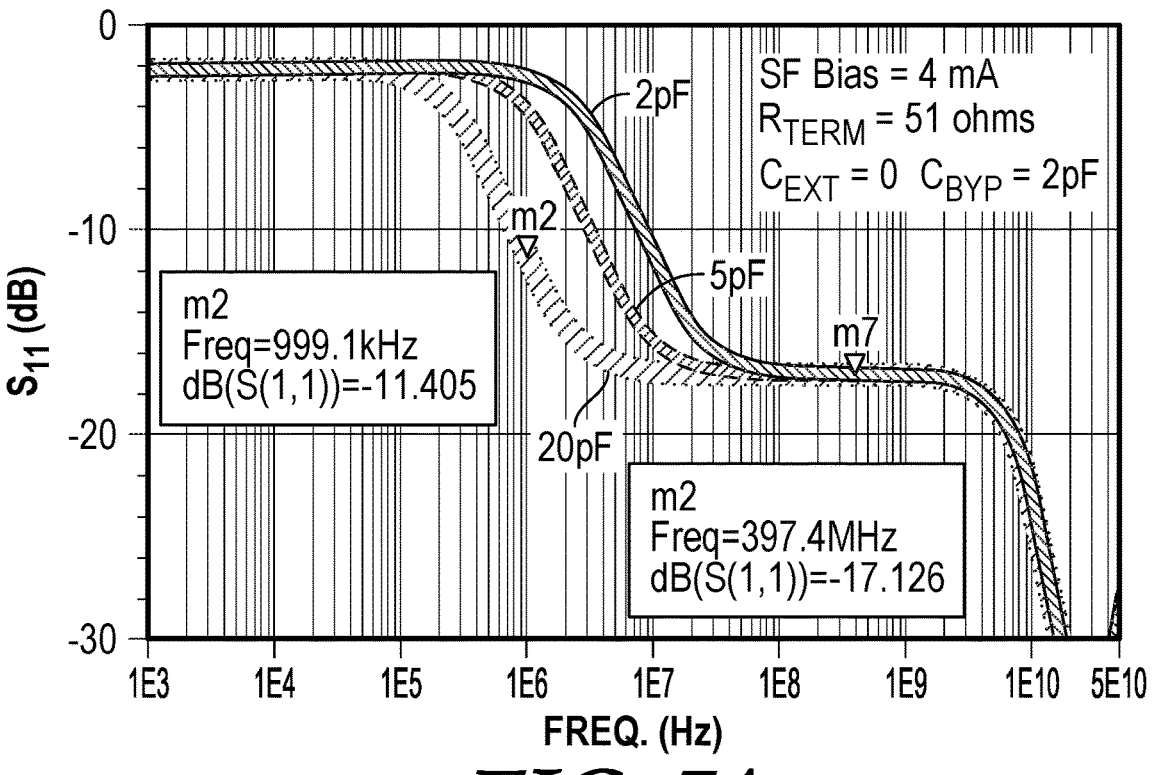
FIG. 7A shows an illustrative example of a simulated return loss (e.g., $S_{11}$ parameter) looking into the termination circuit of FIG. 6, where no external capacitor ($C_{EXT}$) is used, and a fixed termination bypass capacitor ($C_{BYP}$) value is used, showing an effect of different RC filter (C1) capacitor values.

FIG. 7A shows an illustrative example of a simulated return loss (e.g., Su parameter) looking into the termination circuit 108B of FIG. 6, where no external capacitor ($C_{EXT}$) is used, and a fixed termination bypass capacitor ($C_{BYP}$) value of 2 picofarad (pF) is used, showing an effect of different RC filter (C1) capacitor values (and resulting cut-off frequency) from 2 pF to 20 pF. As shown in FIG. 7A, gate termination is effective down to around 1 to 10 MHz depending on C1 values, without $C_{EXT}$, and with an $R_{TERM}$ value of 51 ohms.

Figure 7B:
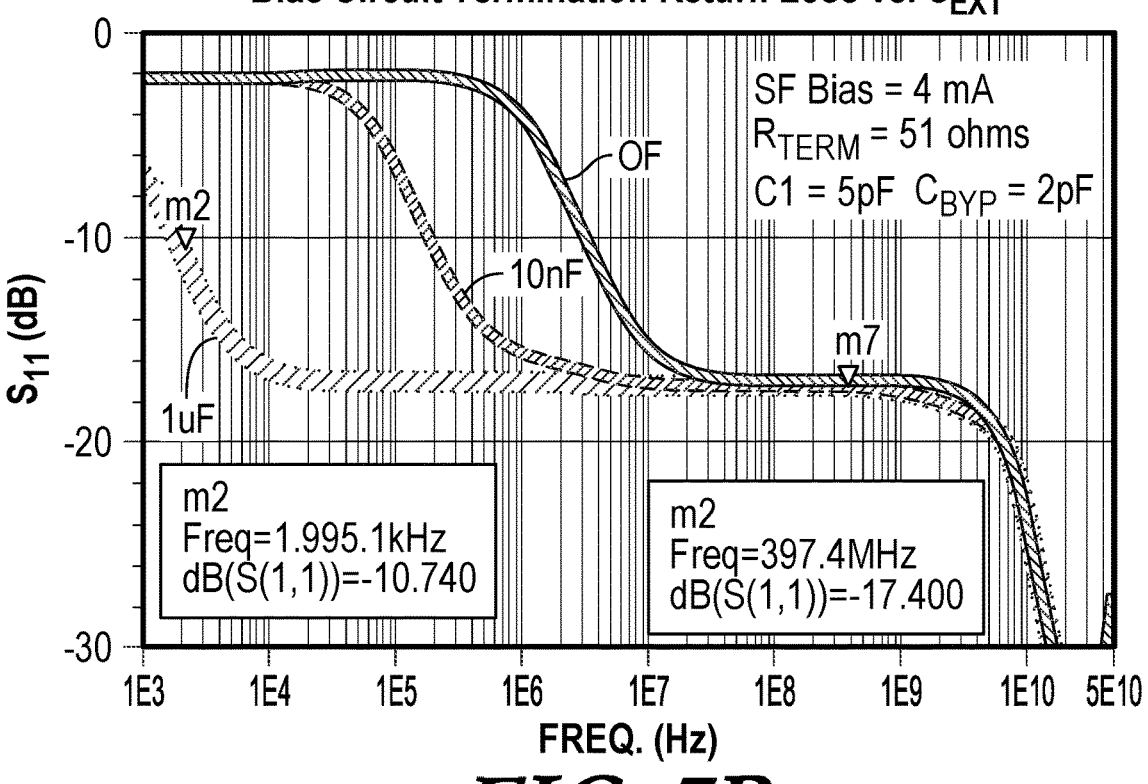
FIG. 7B shows an illustrative example of a simulated return loss (e.g., Si parameter) looking into the termination circuit of FIG. 6, where a fixed termination bypass capacitor ($C_{BYP}$) value and a fixed RC filter (C1) capacitor value are used, showing an effect of different external capacitor ($C_{EXT}$) values.

FIG. 7B shows an illustrative example of a simulated return loss (e.g., $S_{11}$ parameter) looking into the termination circuit 108B of FIG. 6, where a fixed termination bypass capacitor ($C_{BYP}$) value of 2 pF is used, a fixed RC filter (C1) capacitor value of 5 pF is used, showing an effect of different external capacitor ($C_{EXT}$) values from zero to 1 microfarad (μF). As shown in FIG. 7B, non-zero $C_{EXT}$ values do not appreciably impact high frequency performance and reduce a minimum operating frequency from tens of MHz down to KHz range.

Figure 8A:
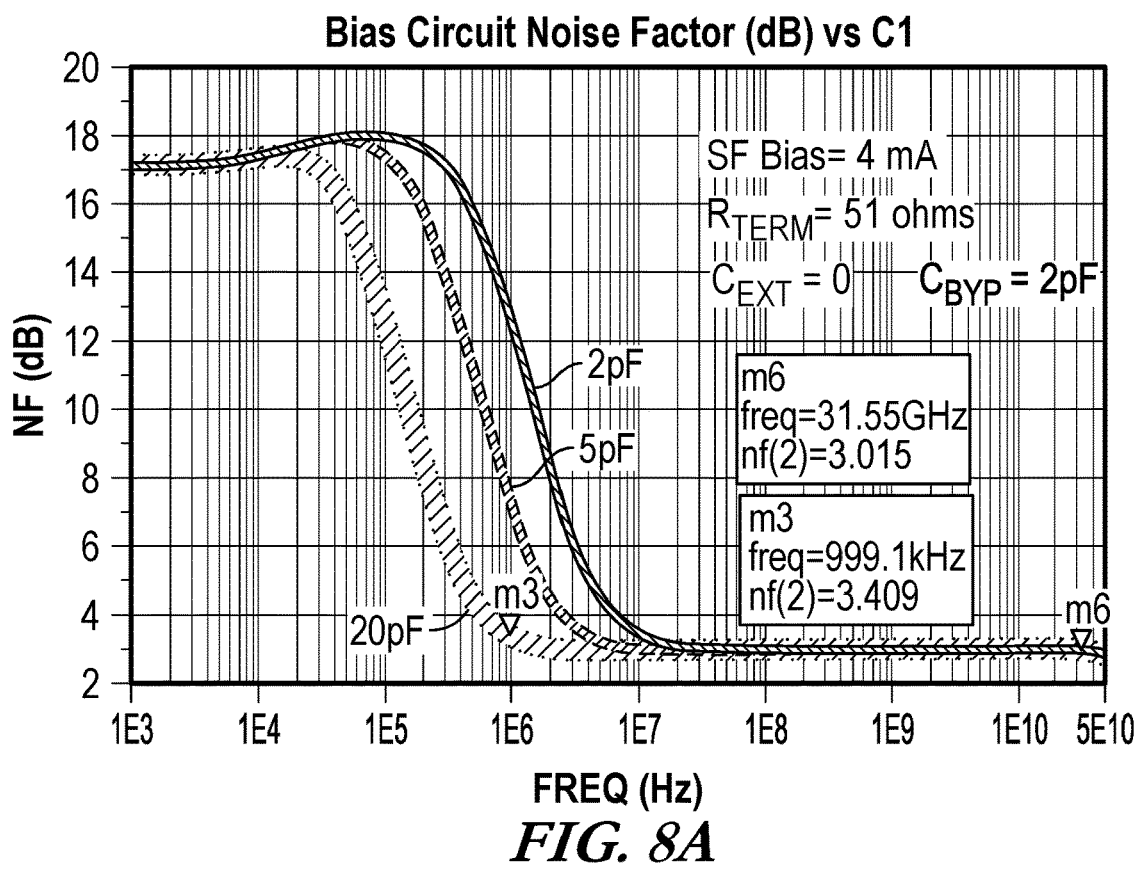
FIG. 8A shows an illustrative example of a simulated noise factor (in dB, corresponding to noise figure, plotted with respect to frequency using logarithmic scaling of the frequency axis), of the DA circuit of FIG. 6, where no external capacitor ($C_{EXT}$) is used, and a fixed termination bypass capacitor ($C_{BYP}$) value is used, showing an effect of different RC filter (C1) capacitor values.

FIG. 8A shows an illustrative example of a simulated noise factor (in dB, corresponding to noise figure, plotted with respect to frequency using logarithmic scaling of the frequency axis), of the DA circuit of FIG. 6, where no external capacitor ($C_{EXT}$) is used, and a fixed termination bypass capacitor ($C_{BYP}$) value of 2 pF is used, showing an effect of different RC filter (C1) capacitor values from 2 pf to 20 pF.

Figure 8B:
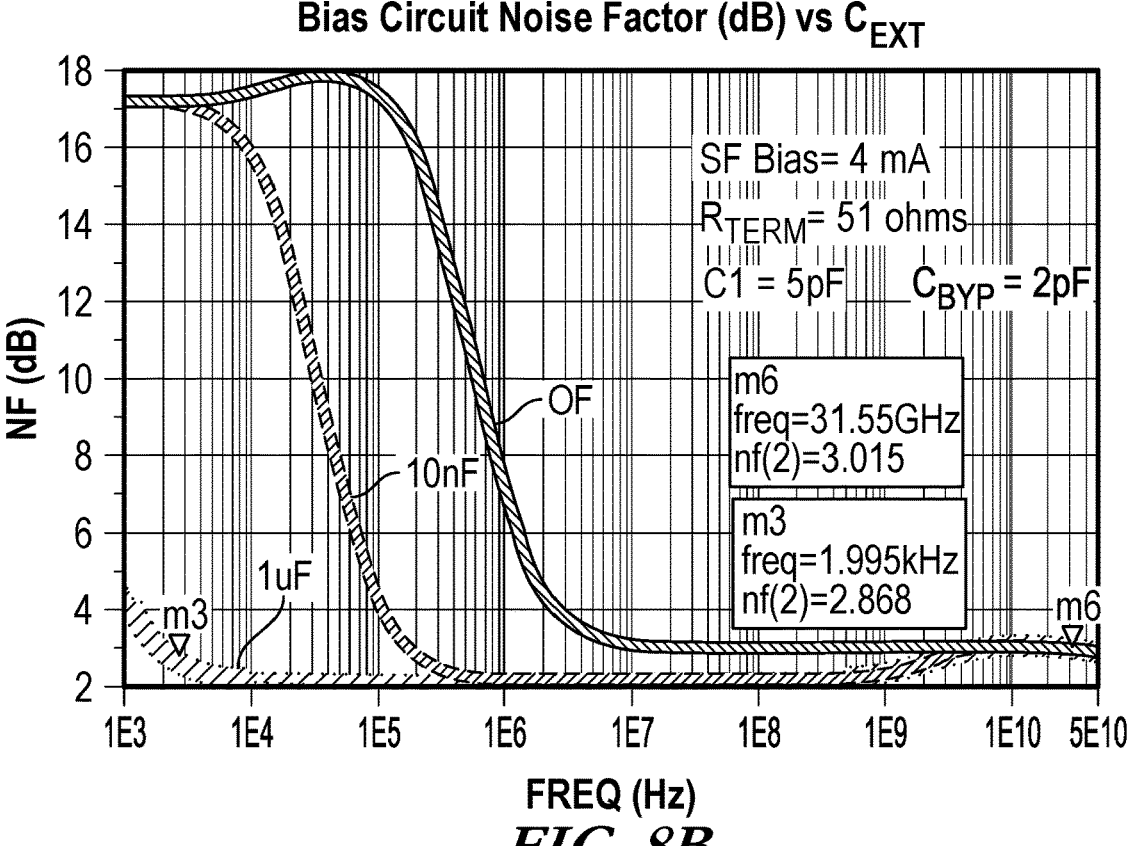
FIG. 8B shows an illustrative example of a simulated noise factor (in dB, corresponding to noise figure, plotted with respect to frequency using logarithmic scaling of the frequency axis), of the DA circuit of FIG. 6, where a fixed termination bypass capacitor ($C_{BYP}$) value and a fixed RC filter (C1) capacitor value are used, showing an effect of different external capacitor ($C_{EXT}$) values.

FIG. 8B shows an illustrative example of a simulated noise factor (in dB, corresponding to noise figure, plotted with respect to frequency using logarithmic scaling of the frequency axis), of the DA circuit of FIG. 6, where a fixed termination bypass capacitor ($C_{BYP}$) value of 2 pF is used, and a fixed RC filter (C1) capacitor value of 5 pF is used, showing an effect of different external capacitor ($C_{EXT}$) values from zero to 1 microfarad (μF). FIG. 8A and FIG. 8B illustrate that noise factor performance is similar to a 3 dB passive termination, down to around 1 to 10 MHz depending on C1 values, when no external capacitor is used, and such performance can be extended to lower frequencies with use of $C_{EXT}$. In each of the simulations shown in FIG. 7A, FIG. 7B, FIG. 8A, and FIG. 8B, an $R_{TERM}$ value of 51 ohms is used.

Figure 9A:
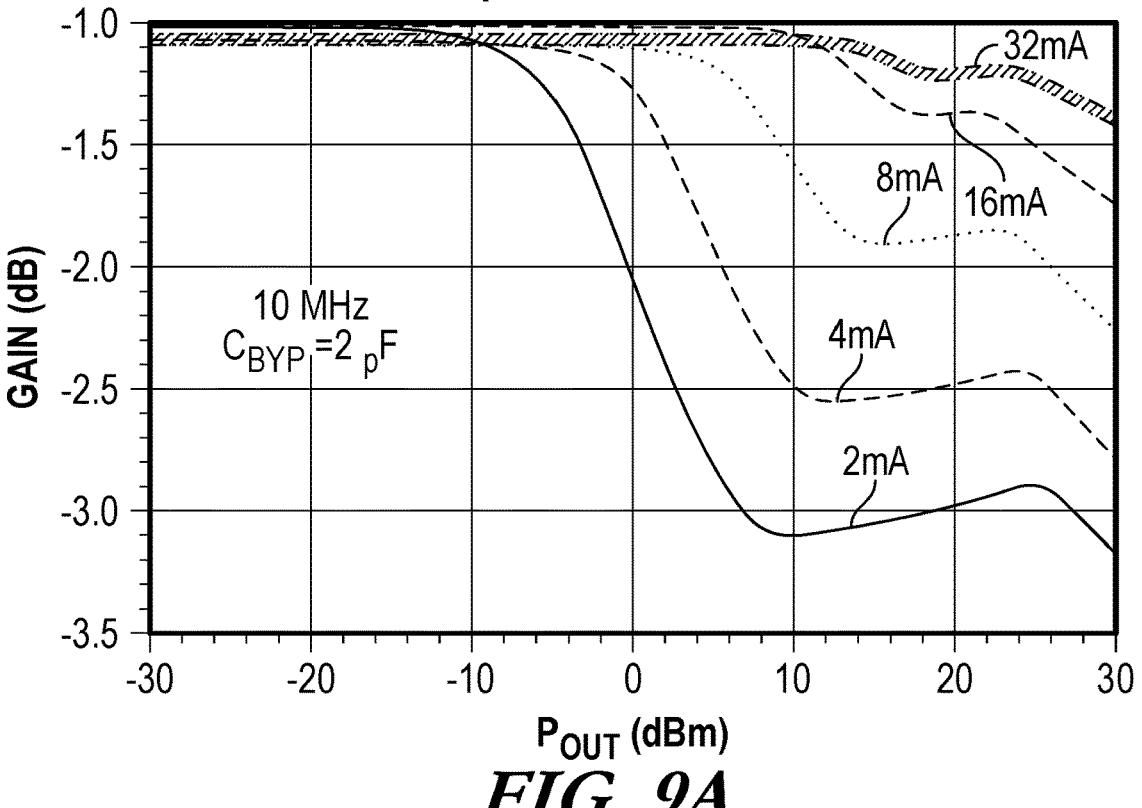
FIG. 9A shows an illustrative example of a simulated output power versus input power for different source follower bias current levels, illustrating gain compression behavior, for a fixed termination bypass capacitor ($C_{BYP}$) value and operating frequency of 10 MHz.
Figure 9B:
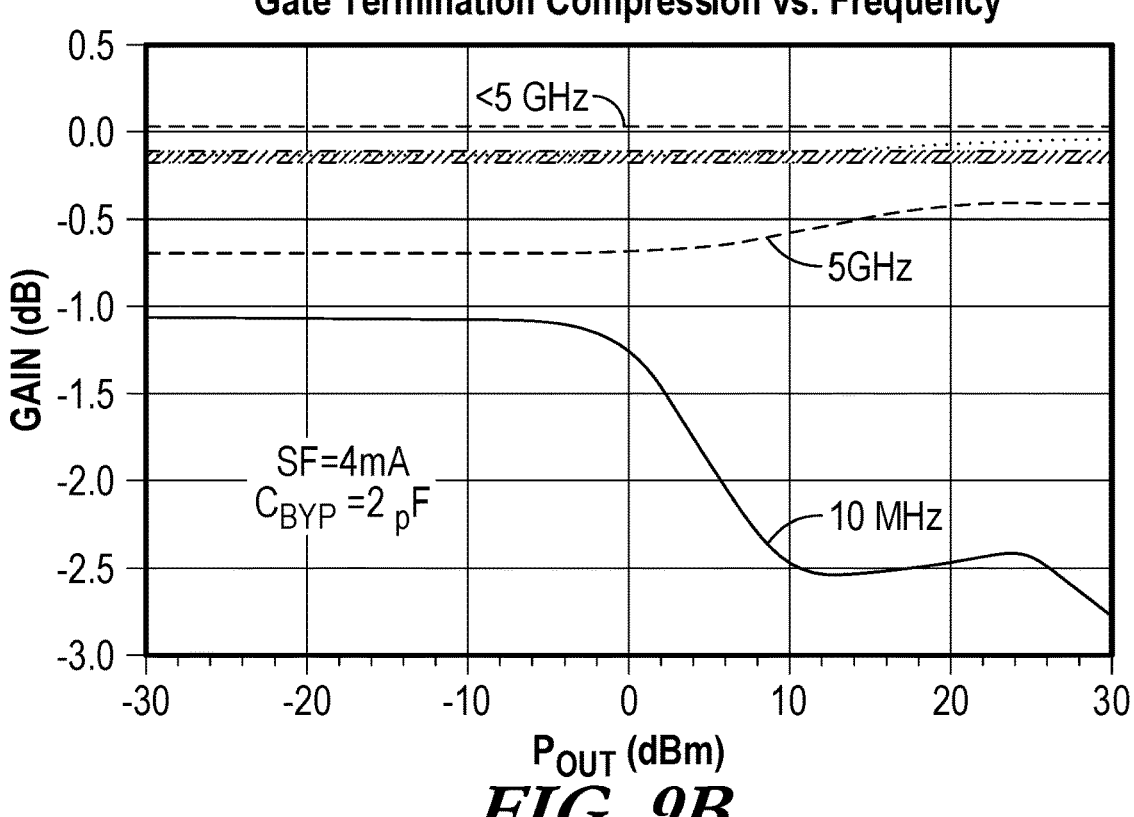
FIG. 9B shows an illustrative example of a simulated output power versus input power for different operating frequencies, illustrating gain compression behavior, for a fixed termination bypass capacitor ($C_{BYP}$) value and fixed source follower bias level of 4 milliamps (mA).

FIG. 9A shows an illustrative example of a simulated output power versus input power for different source follower bias current levels, illustrating gain compression behavior, for a fixed termination bypass capacitor ($C_{BYP}$) value of 2 pF and an operating frequency of 10 MHz. Generally, increasing the source follower (e.g., FET device F2 as shown in FIG. 6) bias current improves compression performance. Similarly, FIG. 9B shows an illustrative example of a simulated output power versus input power for different operating frequencies, illustrating gain compression behavior, for a fixed termination bypass capacitor ($C_{BYP}$) value of 2 pF and fixed source follower bias level of 4 milliamps (mA). In FIG. 9B, the presence of $C_{BYP}$ can improve output compression behavior as frequency increases.

Figure 10A:
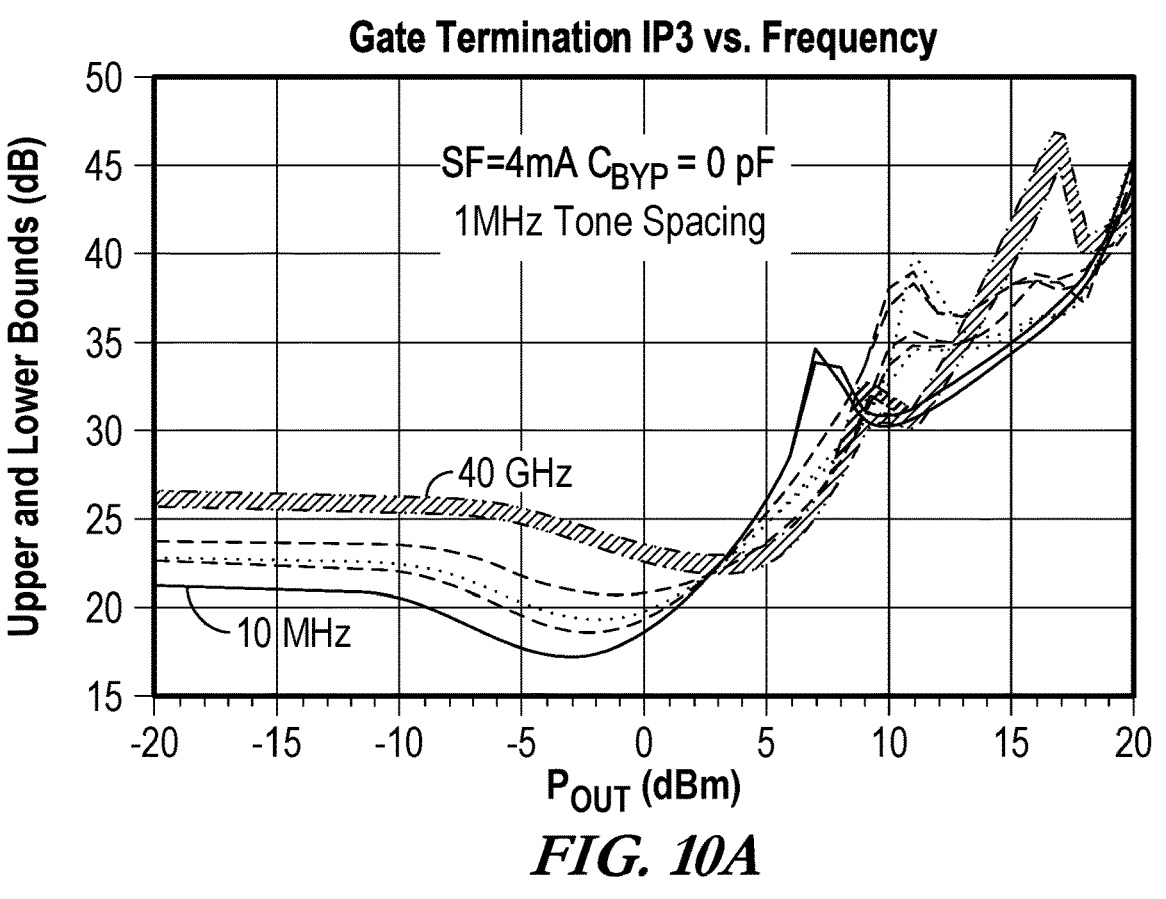
FIG. 10A shows an illustrative example of simulated output third order intercept (IP3) values for different operating frequencies, without $C_{BYP}$, a fixed source follower bias level of 4 mA, and 1 MHz tone spacing.
Figure 10B:
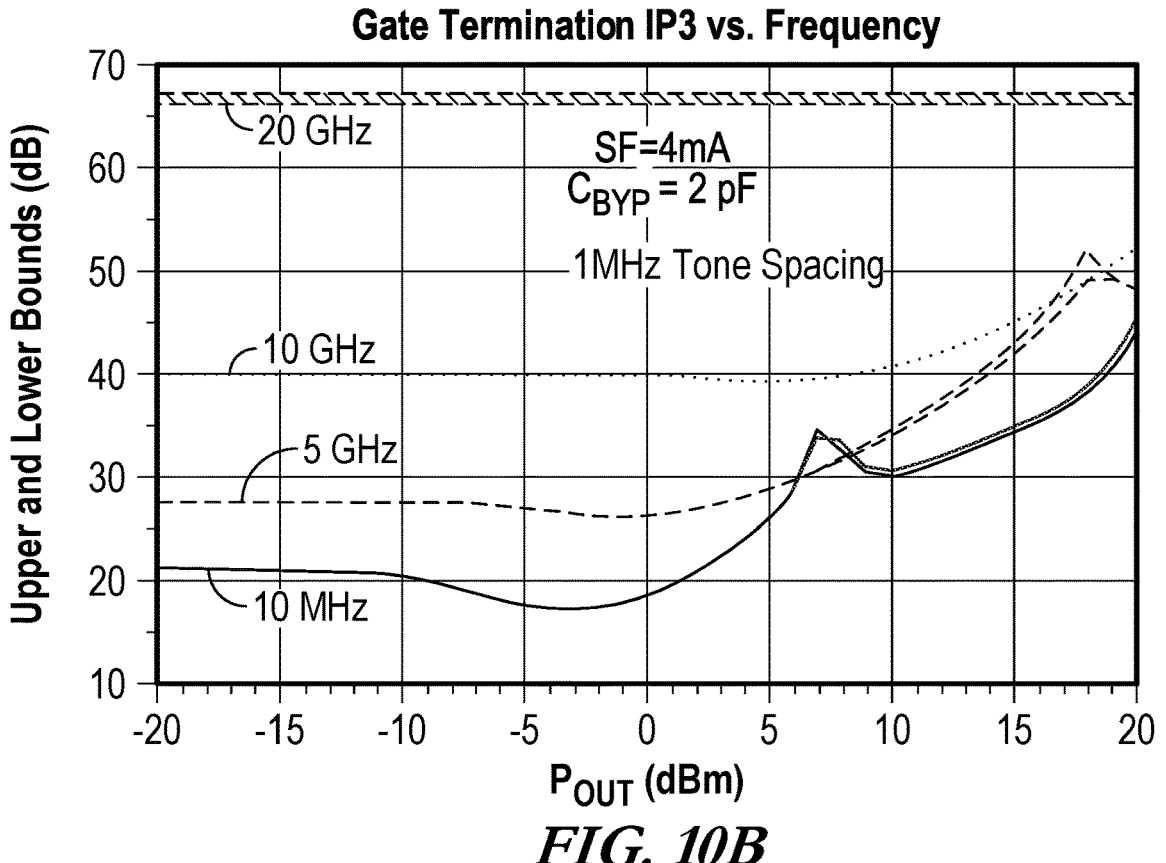
FIG. 10B shows an illustrative example of simulated output third order intercept (IP3) values for different operating frequencies, where a fixed termination bypass capacitor ($C_{BYP}$) value, a fixed source follower bias level of 4 mA, and 1 MHz tone spacing are used.

FIG. 10A shows an illustrative example of simulated output third order intercept (IP3) values for different operating frequencies, without $C_{BYP}$, a fixed source follower bias level of 4 mA, and 1 MHz tone spacing and FIG. 10B shows an illustrative example of simulated output third order intercept (IP3) values for different operating frequencies, where a fixed termination bypass capacitor ($C_{BYP}$) value, a fixed source follower bias level of 4 mA, and 1 MHz tone spacing are used. As shown in FIG. 10B, third-order intercept performance improves with increasing frequency when $C_{BYP}$ is used.

Figure 10C:
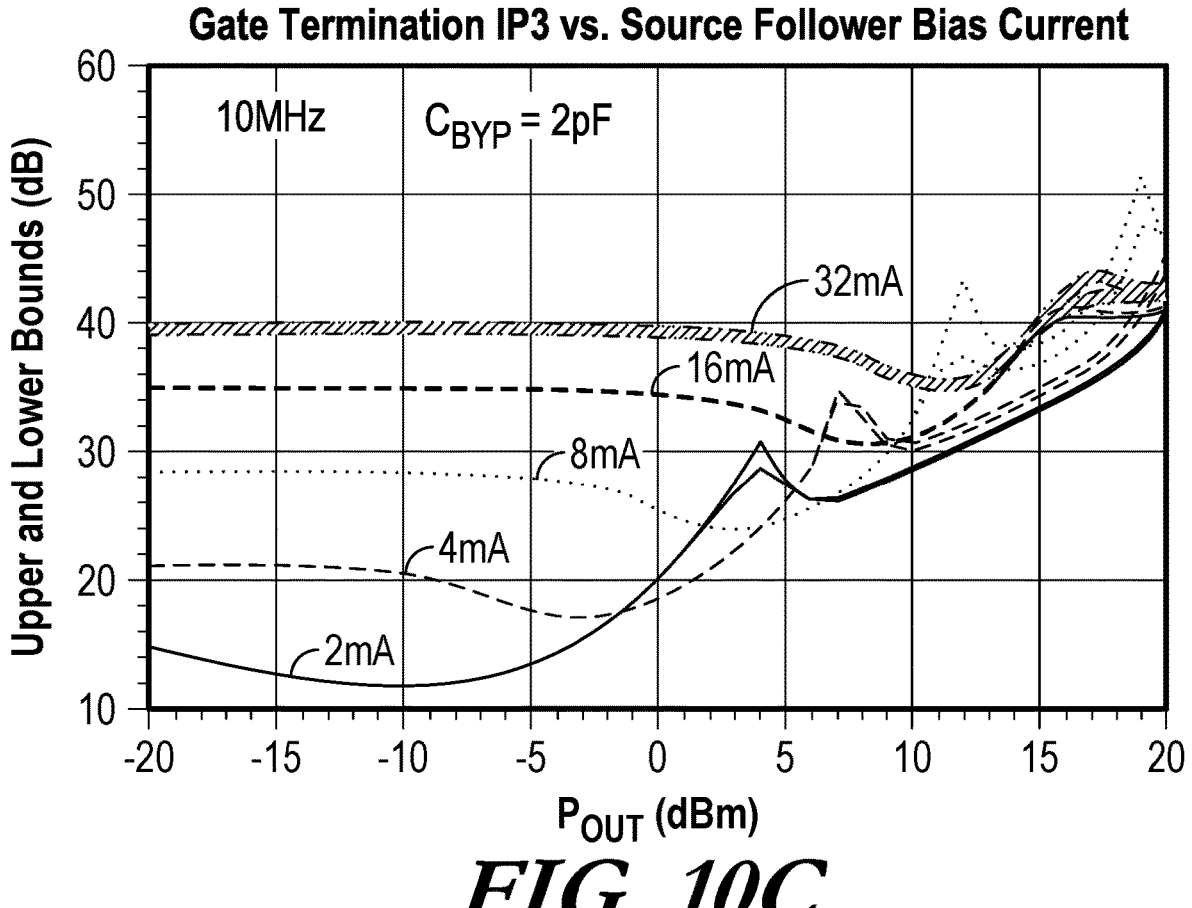
FIG. 10C shows an illustrative example of simulated output third order intercept (IP3) values for different source follower bias current values, where a fixed termination bypass capacitor ($C_{BYP}$) value, and 1 MHz tone spacing are used.

The biasing and termination approaches shown herein are applicable to DA circuits used in low-noise amplifier (LNA) applications, or in power amplification (PA) applications. For example, FIG. 10C shows an illustrative example of simulated output third order intercept (IP3) values for different source follower bias current values, where a fixed termination bypass capacitor ($C_{BYP}$) value, and 1 MHz tone spacing are used. As shown by FIG. 10C, use of a 2 mA to 4 mA source follower bias current appears suitable for LNA applications, and higher current such as the 32-mA bias current may be more suitable for power amplification applications, as illustrative examples.

VARIOUS NOTES

Generally, in the examples discussed in this document, FET devices were modeled using process and device parameters corresponding to gallium arsenide (GaAs) enhancement-mode pseudomorphic high electron mobility transistors (HEMTs), such as fed by a positive-going voltage supply. However, the present inventor has also recognized that the approaches described herein can be used for other transistor architectures or materials. For example, the techniques described herein are applicable to circuit implementations using complementary metal-oxide-semiconductor (CMOS) transistors, bipolar transistors (such as heterojunction bipolar transistors (HBTs)), or depletion-mode devices using a corresponding negative-going supply voltage. The techniques herein are applicable to other compound semiconductors such as gallium nitride, or to silicon-based transistors.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc., are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A distributed amplifier circuit, comprising:

an input transmission line structure comprising first unit cells, a respective one of the first unit cells comprising a first reactive circuit element and a first active circuit element, the first reactive circuit element coupled to an input node of the first active circuit element, an input port of the input transmission line structure defining a signal input port of the distributed amplifier circuit;

an output transmission line structure comprising second unit cells, a respective one of the second unit cells comprising a second reactive circuit element and a second active circuit element, the second reactive circuit element coupled to an output node of the second active circuit element, an output port of the output transmission line structure defining an amplified signal output port of the distributed amplifier circuit; and a termination circuit coupled to an end of the input transmission line structure, the termination circuit configured to establish a specified termination impedance, the termination circuit comprising a current mirror circuit to establish a specified bias current for biasing respective first active circuit elements of the input transmission line structure; and wherein the respective first active circuit elements are coupled with respective second active circuit elements to form respective amplifier circuits, the respective amplifier circuits coupled with each other in a cascaded manner using respective first reactive circuit elements and respective second reactive circuit elements.

2. The distributed amplifier circuit of claim 1, wherein the current mirror circuit is configured to establish the specified bias current and to act as a dissipative element terminating the input transmission line structure.

3. The distributed amplifier circuit of claim 2, wherein current mirror circuit comprises a diode-connected transistor monolithically co-integrated with the respective first active circuit elements and the respective second active circuit elements.

4. The distributed amplifier circuit of claim 1, wherein the termination circuit comprises a passive termination coupled with the current mirror circuit.

5. The distributed amplifier circuit of claim 4, wherein the termination circuit comprises a driver circuit, the driver circuit controlled by the current mirror circuit and configured to maintain the specified bias current for biasing respective first active circuit elements; and wherein the passive termination comprises a resistor located within a feedback loop defined by the driver circuit and the current mirror circuit.

6. The distributed amplifier circuit of claim 5, wherein the termination circuit is monolithically co-integrated with respective first active circuit elements and the respective second active circuit elements.

7. The distributed amplifier circuit of claim 6, wherein the termination circuit comprises a resistor-capacitor (RC) filter in the feedback loop, the RC filter establishing a cut-off frequency corresponding to a minimum operating frequency specification of the distributed amplifier circuit.

8. The distributed amplifier circuit of claim 5, wherein the resistor is located in series between the driver circuit and a node corresponding to the end of the input transmission line structure.

9. The distributed amplifier circuit of claim 1, comprising a feedback resistor coupled between a node corresponding to the end of the input transmission line structure and a node of the output port of the output transmission line structure;

wherein a value of the feedback resistor establishes the specified bias current at least in part.

10. The distributed amplifier circuit of claim 9, wherein the feedback resistor is monolithically co-integrated with respective first active circuit elements and the respective second active circuit elements.

11. The distributed amplifier circuit of claim 1, wherein the current mirror circuit is monolithically co-integrated with the respective first active circuit elements and the respective second active circuit elements; and wherein the distributed amplifier circuit further comprises a bias control node coupled to the current mirror circuit, the bias control node coupleable to a bias control component that is not monolithically co-integrated with the current mirror circuit.

12. The distributed amplifier circuit of claim 11, wherein the bias control node is coupleable to a reactive component that establishes a cut-off frequency corresponding to a minimum operating frequency specification of the distributed amplifier circuit.

13. The distributed amplifier circuit of claim 12, wherein the bias control component comprises a resistor and the reactive component comprises a capacitor.

14. The distributed amplifier circuit of claim 1, wherein the respective first active circuit elements and respective second active circuit elements comprise transistors monolithically co-integrated with the current mirror circuit.

15. The distributed amplifier circuit of claim 14, wherein the transistors comprise field effect transistors, the field effect transistors comprising compound-semiconductor high-electron-mobility transistors (HEMTs).

16. The distributed amplifier circuit of claim 1, wherein within respective first unit cells, the first reactive circuit element establishes a series inductance, and the first active circuit element establishes a shunt capacitance.

17. A distributed amplifier circuit, comprising:

an input transmission line structure;

an output transmission line structure;

a termination circuit coupled to an end of the input transmission line structure, the termination circuit configured to establish a specified termination impedance, the termination circuit comprising a current mirror circuit to establish a specified bias current for biasing respective first active circuit elements of the input transmission line structure; and a feedback resistor coupled between a node corresponding to the end of the input transmission line structure and a node of an output port of the output transmission line structure, a value of the feedback resistor establishing the specified bias current at least in part;

wherein the current mirror circuit is monolithically co-integrated with the respective first active circuit elements; and wherein the distributed amplifier circuit further comprises a bias control node coupled to the current mirror circuit, the bias control node coupleable to a bias control component that is not monolithically co-integrated with the current mirror circuit.

18. The distributed amplifier circuit of claim 17, further comprising the bias control component, the bias control component comprising a resistor.

19. The distributed amplifier circuit of claim 17, wherein the bias control node is coupleable to a reactive component that establishes a cut-off frequency corresponding to a minimum operating frequency specification of the distributed amplifier circuit.

20. A monolithically-integrated distributed amplifier circuit, comprising:

an input transmission line structure comprising respective first active circuit elements;

an output transmission line structure comprising respective second active circuit elements; and a termination circuit coupled to an end of the input transmission line structure, the termination circuit configured to establish a specified termination impedance, the termination circuit comprising a current mirror circuit to establish a specified bias current for biasing the respective first active circuit elements of the input transmission line structure;

wherein the respective first active circuit elements and the respective second active circuit elements comprise compound-semiconductor high-electron-mobility transistors (HEMTs); and wherein the current mirror circuit comprises a diode-connected field effect transistor (FET).

* * * * *